United States Patent
Fenger et al.

(10) Patent No.: US 11,023,644 B1
(45) Date of Patent: Jun. 1, 2021

(54) OPTICAL PROXIMITY CORRECTION MODELING WITH DENSITY-BASED GAUGE WEIGHTING

(71) Applicant: Mentor Graphics Corporation, Wilsonville, OR (US)

(72) Inventors: Germain Louis Fenger, Gladstone, OR (US); Andrew Burbine, Rochester, NY (US); Christopher Clifford, Alameda, CA (US)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 16/997,312

(22) Filed: Aug. 19, 2020

Related U.S. Application Data (60) Provisional application No. 63/050,625, filed on Jul. 10, 2020.

(51) Int. Cl.
*G06F 30/392* (2020.01)
*G06F 30/398* (2020.01)
*G06F 30/33* (2020.01)

(52) U.S. Cl.
CPC .......... *G06F 30/392* (2020.01); *G06F 30/33* (2020.01); *G06F 30/398* (2020.01)

(58) Field of Classification Search
CPC .......... G03F 1/36; G03F 1/70; G03F 7/70425; G03F 7/70441; G06F 30/398; G06F 30/392; G06F 30/33; H01J 2237/31769
See application file for complete search history.

(56) References Cited

U.S. PATENT DOCUMENTS

| | | | | |
|---|---|---|---|---|
| 8,887,105 | B1 * | 11/2014 | Bruguier | G03F 1/70 716/52 |
| 2009/0249261 | A1 * | 10/2009 | Kim | G03F 1/36 716/132 |
| 2010/0280812 | A1 * | 11/2010 | Zhang | G03F 7/70625 703/13 |

(Continued)

OTHER PUBLICATIONS

Abdo, Amr, Fathy, Rami, Madkour, Kareem, Oberschmidt, James, Fischer, Daniel, et al., "The effect of calibration feature weighting on OPC optical and resist models: investigation the influence on model coefficients and on the overall model fitting", Proceedings of SPIE, vol. 5992, 25th Annual BACUS Symposium on Photomask Technology, Nov. 9, 2005, Monterey, CA, US, pp. 599523-1 to 599253-8.

*Primary Examiner* — Nha T Nguyen (57) ABSTRACT

This application discloses a computing system implementing an optical proximity correction model calibration tool to determine parameters for gauges describing features of an integrated circuit. The gauges include values corresponding to measurements collected for a set of the features. The optical proximity correction model calibration tool can ascertain densities of the gauges based on the measurements associated with the parameters for the gauges, and set weights for the gauges based, at least in part, on the densities. The optical proximity correction model calibration tool can calibrate an optical proximity correction (OPC) model using the weights for the gauges. The OPC model calibrated with the weights of the gauges can be utilized to predict of a printed image on a substrate described by a mask layout design corresponding to the integrated circuit.

20 Claims, 4 Drawing Sheets

(56) References Cited

U.S. PATENT DOCUMENTS

| | | | |
|---|---|---|---|
| 2011/0179393 A1* | 7/2011 | Xue | G03F 7/705 |
| | | | 716/55 |
| 2013/0254724 A1* | 9/2013 | Parikh | G03F 7/70516 |
| | | | 716/53 |
| 2016/0283617 A1* | 9/2016 | Bailey | G03F 7/70625 |
| 2018/0067900 A1* | 3/2018 | Mos | G03F 7/70633 |

* cited by examiner

OPTICAL PROXIMITY CORRECTION MODELING WITH DENSITY-BASED GAUGE WEIGHTING

RELATED APPLICATION

This patent application claims priority to U.S. Provisional Patent Application No. 63/050,625, filed Jul. 10, 2020, which is incorporated by reference herein.

TECHNICAL FIELD

This application is generally related to electronic design automation and, more specifically, to optical proximity correction modeling with density-based gauge weighting.

BACKGROUND

In a design flow for fabricating integrated circuits, a physical design of an integrated circuit can describe specific geometric elements, often referred to as a layout design. The geometric elements, which typically are polygons, define the shapes that will be created in various materials to manufacture the integrated circuit. Typically, a designer will select groups of geometric elements representing circuit device components, e.g., contacts, gates, etc., and place them in a design area. These groups of geometric elements may be custom designed, selected from a library of previously-created designs, or some combination of both. Once the groups of geometric elements representing circuit device components have been placed, geometric elements representing connection lines then are then placed between these geometric elements according to the predetermined route. These lines will form the wiring used to interconnect the electronic devices.

Descriptions for physical designs of integrated circuits can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway, EDDM, and Open Artwork System Interchange Standard (OASIS). These various industry formats are used to define the geometrical information in layout designs that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask is created to expose only the desired areas to the radiation, and to protect the other areas from exposure. The mask is created from circuit layout data. That is, the geometric elements described in a layout design define the relative locations or areas of the circuit that will be exposed to radiation through the mask. A mask or reticle writing tool is used to create the mask based upon the layout design, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the layout design onto the substrate. The diffractive effects of light often result in defects where the intended image is not accurately printed onto the substrate during the photolithographic process, creating flaws in the manufactured device. One or more resolution enhancement techniques (RETs) are often employed to improve the resolution of the image that the mask forms on the substrate during the photolithographic process.

One of these techniques—optical proximity correction (OPC)—adjusts the amplitude of the light transmitted through a lithographic mask by modifying the mask layout design data employed to create the mask. For example, edges in the mask layout design may be adjusted to make certain portions of the geometric elements larger or smaller, in accordance with how much additional light exposure (or lack of exposure) is desired at certain points on the substrate. When these adjustments are appropriately calibrated, overall pattern fidelity can be increased.

A specific form of optical proximity correction, called model-based optical proximity correction, can utilize the mask layout design data along with an optical proximity correction model, such as an OPC compact resist model, to predict a printed image on a substrate resulting from the light exposure through one or more masks described by the mask layout design data and then modify the mask layout design data. OPC models typically include multiple design features or gauges, which can be weighted in the OPC models relative to each other. The weights of the features or gauges can be used in the optical proximity correction to modify the mask layout design data. For example, when the OPC model has a higher weight assigned to a gauge, the model-based optical proximity correction allows a smaller error for that gauge during modification of the mask layout design data. The accuracy of the model-based optical proximity correction often depends on the accuracy of the OPC model and, in particular, the weights assigned to the features or gauges in the OPC model. An OPC calibration process that set the weights for the gauges, however, is often performed by trial and error or set by the user based on pattern importance, which can lead to over fit OPC models and inaccurate model-based optical proximity correction.

SUMMARY

This application discloses a computing system implementing an optical proximity correction (OPC) model calibration tool to automatically set weights for an OPC model used in various downstream tools in an integrated circuit design flow. Rather than utilizing a trial and error approach or rely on user set weighting, the OPC model calibration tool can automatically set the weighs by determining densities of gauges associated with an integrated circuit design based on parameters defined in feature vectors and then utilizing the densities to set the weights for an OPC model. In some embodiments, the computing system implementing an optical proximity correction model calibration tool can determine parameters for gauges describing features of an integrated circuit. The gauges include values corresponding to measurements collected for a set of the features. The optical proximity correction model calibration tool can ascertain densities of the gauges based on the measurements associated with the parameters for the gauges, and set weights for the gauges based, at least in part, on the densities. The optical proximity correction model calibration tool can calibrate an optical proximity correction (OPC) model using the weights for the gauges. The OPC model calibrated with the weights of the gauges can be utilized to predict a printed image on a substrate described by a mask layout design corresponding to the integrated circuit. Embodiments of will be described below in greater detail.

DETAILED DESCRIPTION

Illustrative Operating Environment

Figure 1:
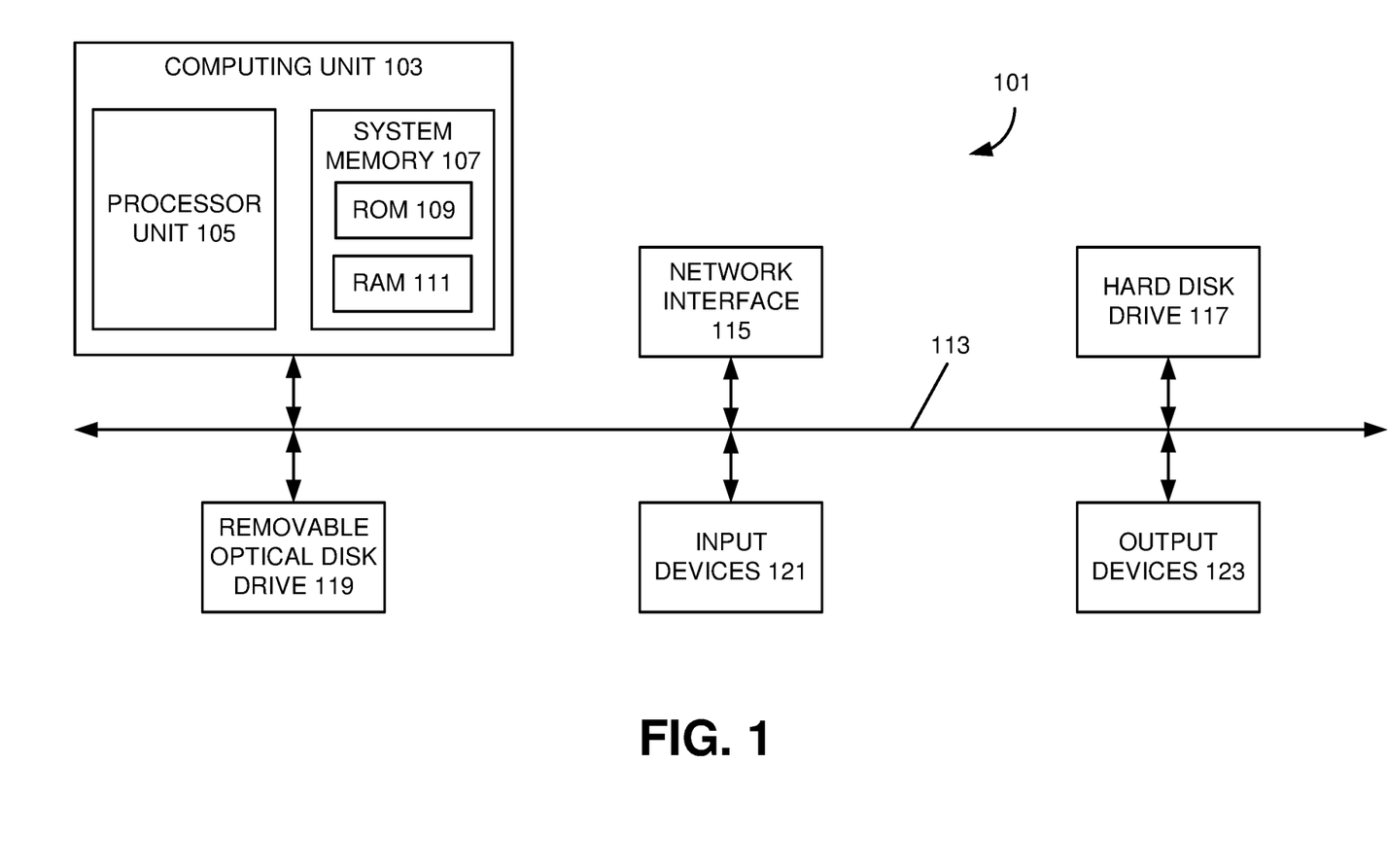
FIGS. 1 and 2 illustrate an example of a computer system of the type that may be used to implement various embodiments.

Various examples may be implemented through the execution of software instructions by a computing device 101, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices 115-123. For example, the processing unit 105 or the system memory 107 may be directly or indirectly connected to one or more additional memory storage devices, such as a hard disk drive 117, which can be magnetic and/or removable, a removable optical disk drive 119, and/or a flash memory card. The processing unit 105 and the system memory 107 also may be directly or indirectly connected to one or more input devices 121 and one or more output devices 123. The input devices 121 may include, for example, a keyboard, a pointing device (such as a mouse, touchpad, stylus, trackball, or joystick), a scanner, a camera, and a microphone. The output devices 123 may include, for example, a monitor display, a printer and speakers. With various examples of the computing device 101, one or more of the peripheral devices 115-123 may be internally housed with the computing unit 103. Alternately, one or more of the peripheral devices 115-123 may be external to the housing for the computing unit 103 and connected to the bus 113 through, for example, a Universal Serial Bus (USB) connection.

With some implementations, the computing unit 103 may be directly or indirectly connected to a network interface 115 for communicating with other devices making up a network. The network interface 115 can translate data and control signals from the computing unit 103 into network messages according to one or more communication protocols, such as the transmission control protocol (TCP) and the Internet protocol (IP). Also, the network interface 115 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computing device 101 is illustrated as an example only, and it not intended to be limiting. Various embodiments may be implemented using one or more computing devices that include the components of the computing device 101 illustrated in FIG. 1, which include only a subset of the components illustrated in FIG. 1, or which include an alternate combination of components, including components that are not shown in FIG. 1. For example, various embodiments may be implemented using a multi-processor computer, a plurality of single and/or multiprocessor computers arranged into a network, or some combination of both.

Figure 2:
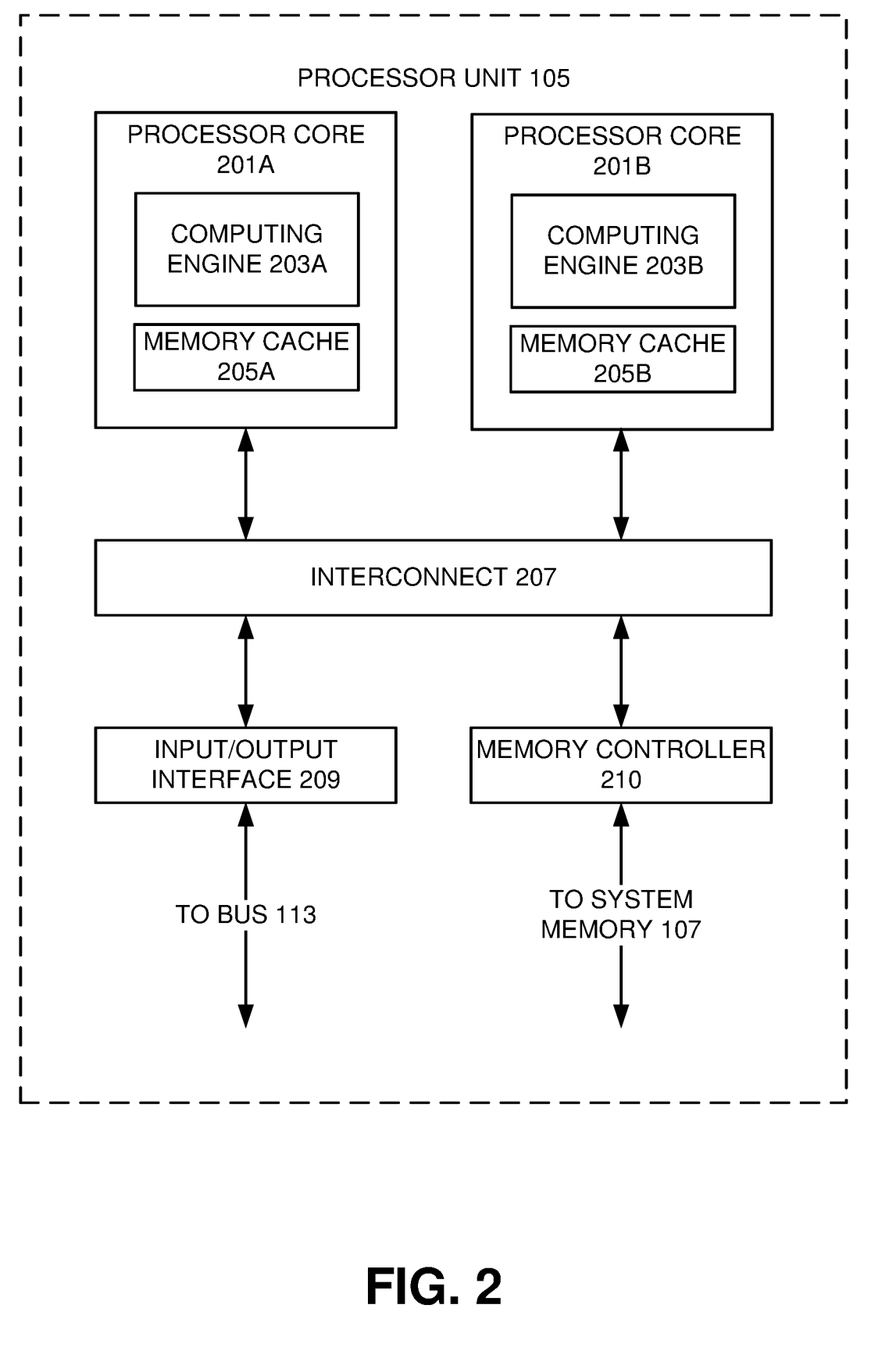

With some implementations, the processor unit 105 can have more than one processor core. Accordingly, FIG. 2 illustrates an example of a multi-core processor unit 105 that may be employed with various embodiments. As seen in this figure, the processor unit 105 includes a plurality of processor cores 201A and 201B. Each processor core 201A and 201B includes a computing engine 203A and 203B, respectively, and a memory cache 205A and 205B, respectively. As known to those of ordinary skill in the art, a computing engine 203A and 203B can include logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203A and 203B may then use its corresponding memory cache 205A and 205B, respectively, to quickly store and retrieve data and/or instructions for execution.

Each processor core 201A and 201B is connected to an interconnect 207. The particular construction of the interconnect 207 may vary depending upon the architecture of the processor unit 105. With some processor cores 201A and 201B, such as the Cell microprocessor created by Sony Corporation, Toshiba Corporation and IBM Corporation, the interconnect 207 may be implemented as an interconnect bus. With other processor units 201A and 201B, however, such as the Opteron™ and Athlon™ dual-core processors available from Advanced Micro Devices of Sunnyvale, Calif., the interconnect 207 may be implemented as a system request interface device. In any case, the processor cores 201A and 201B communicate through the interconnect 207 with an input/output interface 209 and a memory controller 210. The input/output interface 209 provides a communication interface to the bus 113. Similarly, the memory controller 210 controls the exchange of information to the system memory 107. With some implementations, the processor unit 105 may include additional components, such as a high-level cache memory accessible shared by the processor cores 201A and 201B. It also should be appreciated that the description of the computer network illustrated in FIG. 1 and FIG. 2 is provided as an example only, and it not intended to suggest any limitation as to the scope of use or functionality of alternate embodiments.

Optical Proximity Correction Modeling with Density-Based Gauge Weighting

Figure 3:
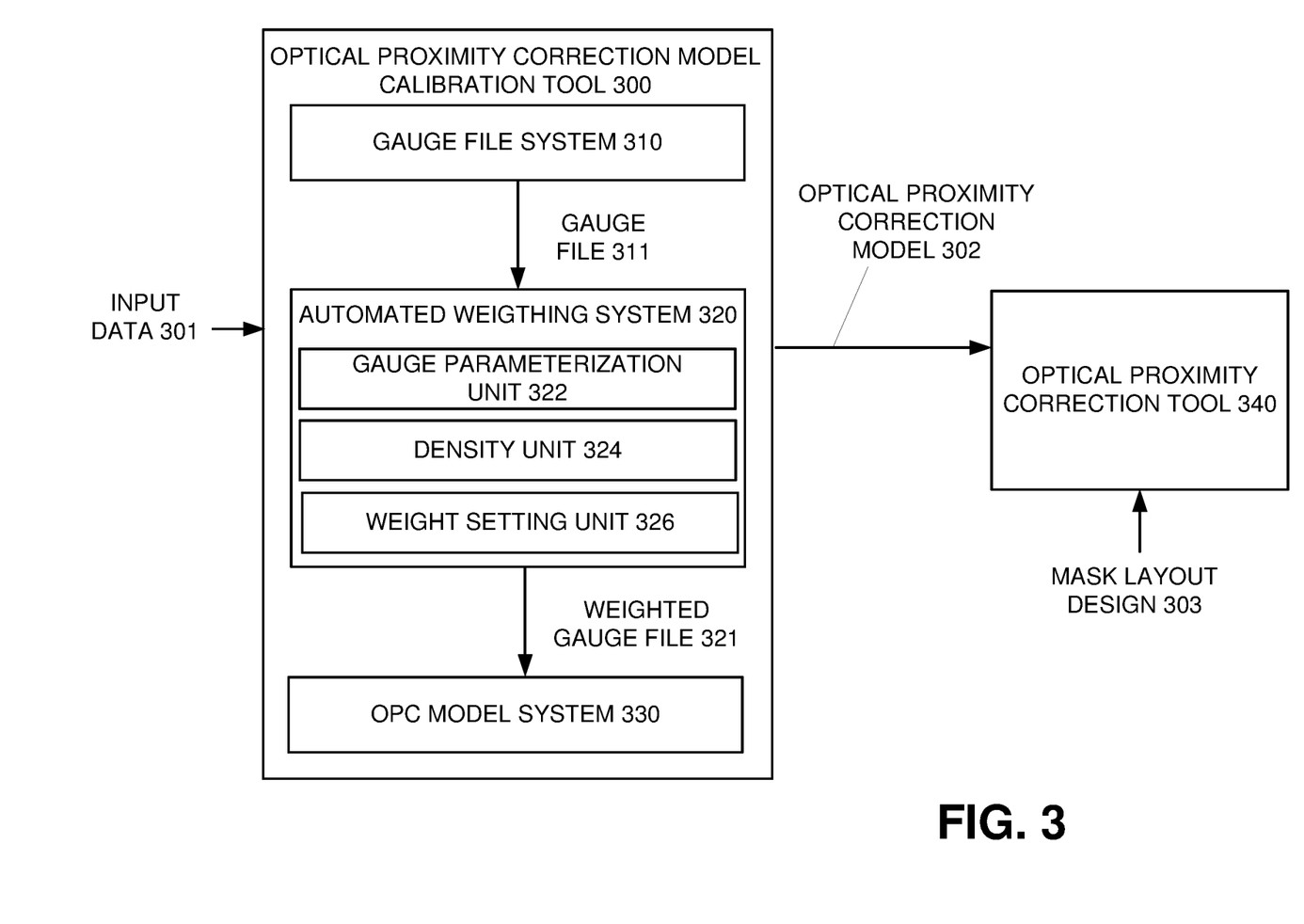
FIG. 3 illustrates an example of an optical proximity correction (OPC) calibration tool implementing density-based OPC model calibration according to various embodiments.
Figure 4:
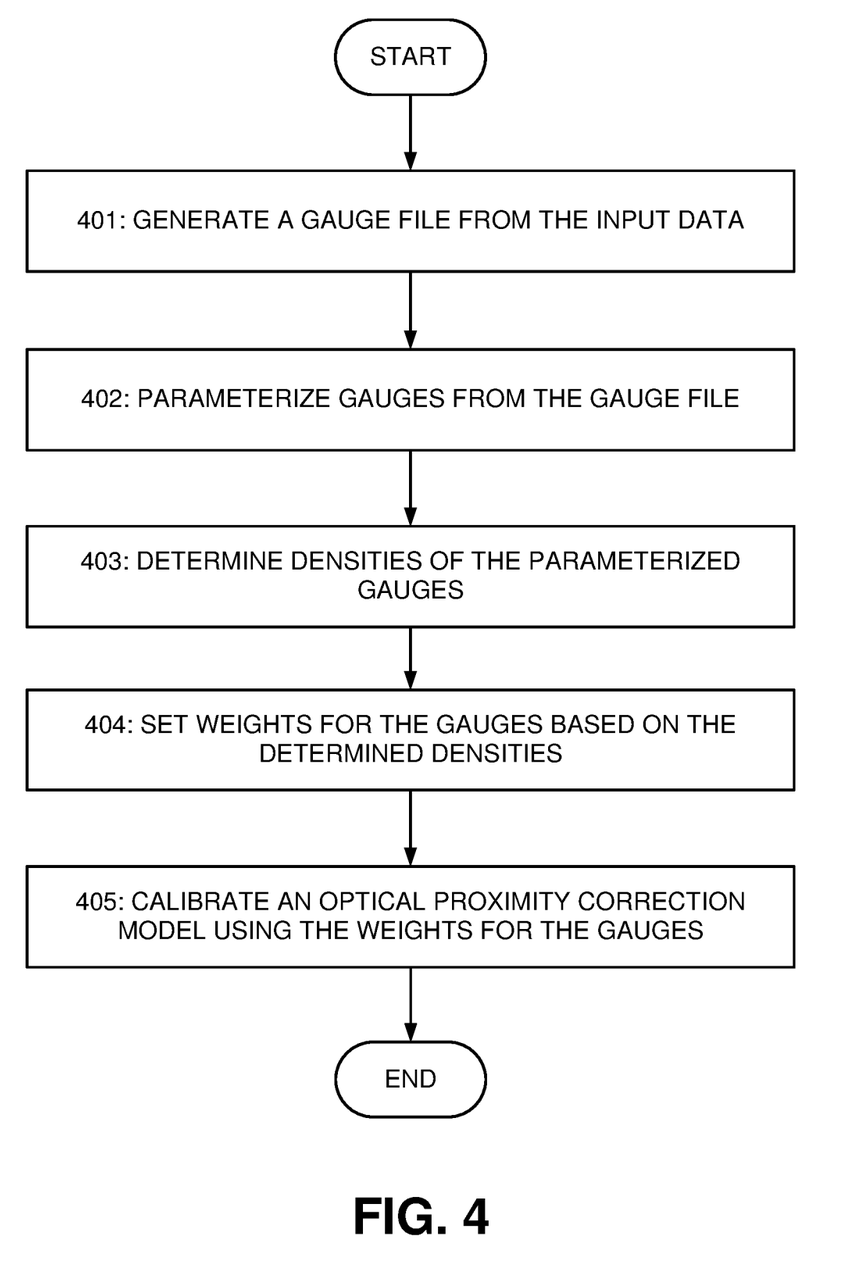
FIG. 4 illustrates a flowchart showing example density-based optical proximity correction (OPC) model calibration according to various examples.

FIG. 3 illustrates an example of an optical proximity correction (OPC) model calibration tool 300 implementing density-based OPC model calibration according to various embodiments. FIG. 4 illustrates a flowchart showing example density-based optical proximity correction (OPC) model calibration according to various examples. Referring to FIGS. 3 and 4, the OPC model calibration tool 300 can receive input data 301, which can include measurements collected during optical lithographic experiments for different features on a wafer, for example, performed by a foundry at a manufacturing process node. The input data 301, for example, formatted in a text file, can identify the feature that was measured, the location of the feature on the wafer, one or more measurements related to the feature, such as a one-dimensional width, pitch, or critical dimension, or the like. In some embodiments, the input data 301 can include a filtered version of the measurements, for example, having the outlier measurements removed.

The OPC model calibration tool 300 can include a gauge file system 310 that, in a block 401, can generate a gauge file 311 from the input data 301. The gauge file system 310 can determine gauges from the measurements of features in the input data 301 and then combine the gauges into the gauge file. In some embodiments, the gauge file system 310 can identify features in the input data 301 that are the same or similar, and then aggregate the measurement values for the identified features, for example, by averaging them, to determine the gauge for the identified features. In some examples, a gauge can represent a set of similar features of an integrated circuit and include an aggregated measurement value to associate with those features.

The OPC model calibration tool 300 can include an automated weighting system 320 to set weights to the gauges in the gauge file and generate a weighted gauge file 321. The automated weighting system 320 can include a gauge parameterization unit 322 that, in a block 402, can convert the gauges in the gauge file 311 into feature vectors with parameterized measurement values. The parameterized measurements can include values corresponding to geometric properties, kernel properties, resist model properties, etch model properties, intensity value properties, or the like, for the gauges. In some embodiments, the feature vectors can include over 60 different parameterized measurements for the gauges.

The automated weighting system 320 can include a density unit 324 that, in a block 404, identify densities of the parameterized gauges based on the parameterized measurement values. In some embodiments, the density unit 324 can group the gauges based on their parameterized measurement values, for example, utilizing a clustering algorithm, and then identify the densities for the gauges based on the relative densities for the gauge groups. For example, when a gauge group includes 10% of the gauges in the gauge file 311, the density unit 324 can determine the density of each of the gauges in the gauge group corresponds to 10%.

In some embodiments, the density unit 324 can identify densities of gauges using a nearest neighbor density determination, for example, by applying a Euclidean distance algorithm to parameters of the gauges, which can allow the density unit 324 to set a density for each gauge. The density unit 324 also can determine densities of gauges using a Kernel Density Estimation algorithm, which can determine a probability density function for the gauges and individual densities for each gauge.

In some embodiments, the automated weighting system 320 can reduce a dimensionality of the parameterized gauges, for example, using a principal component analysis (PCA) or other similar process, for example, prior to the density unit 324 determining densities of gauges from the dimensionally-reduced parameterized gauges.

The automated weighting system 320 can include a weigh setting unit 326 that, in a block 404, can to set the weights for the gauges based on the densities of the gauges. In some embodiments, the weights for the gauges can correspond to the inverse of the densities of the gauges. For example, when the density of a gauge corresponds to 20%, the weight for the gauge can be set as 5. The weigh setting unit 326 can generate the weighted gauge file 321 by populating the set weights into the gauge file 311.

The OPC model calibration tool 300 can include an OPC model system 330 that, in a block 405, can calibrate an optical proximity correction model 302 based on the weighted gauge file 321. In some embodiments, the weighted gauge file 321 can alter an operation of a cost function in the optical proximity correction model 302. For example, the cost function in the optical proximity correction model 302 can utilize the weights in the weighted gauge file 321 to favor smaller errors for gauges with higher weights and vice versa.

The optical proximity correction model 302 calibrated by the OPC model calibration tool 300 can be utilized by downstream design and analysis tools, such as an optical proximity correction tool 340, a design verification tool, a mask or reticle writing tool, or the like. In this example, the optical proximity correction tool 340 can receive the optical proximity correction model 302 from the OPC model calibration tool 300 and perform model-based optical proximity correction on a mask layout design 303. The optical proximity correction tool 340 can utilize the mask layout design 303 along with an optical proximity correction model 302 to predict a printed image on a substrate resulting from the light exposure through one or more masks described by the mask layout design 303 and then modify the mask layout design 303 to increase overall pattern fidelity. The optical proximity correction tool 340 can use the optical proximity correction model 302 and weights of gauges to determine errors for features predicted to be formed based on the mask layout design 303 and then modify the mask layout design 303 based on the determined errors.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like, which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
   determining, by a computing system, parameters for a set of gauges describing features of an integrated circuit, wherein each gauge includes values corresponding to measurements collected for a set of the features;
   ascertaining, by the computing system, densities of the gauges, wherein each of the densities corresponds to a relationship between the measurements associated with the parameters for one of the gauges and the measurements associated with the parameters for other gauges in the set of the gauges;
   setting, by the computing system, weights for the gauges based, at least in part, on the densities of the gauges; and
   calibrating, by the computing system, an optical proximity correction (OPC) model using the weights for the gauges, wherein the OPC model calibrated with the weights of the gauges is configured to allow prediction of a printed image on a substrate described by a mask layout design corresponding to the integrated circuit.

2. The method of claim 1, further comprises generating, by the computing system, the gauges by grouping the features of an integrated circuit and associating an aggregation of the measurements for the features in each of the groups to gauges.

3. The method of claim 1, wherein ascertaining the densities of the gauges further comprises:
   grouping the gauges based on their parameterized measurement values;
   identifying relative densities for the groups for the groups of the gauges; and
   determining the densities for the gauges based on the relative densities for the groups of the gauges.

4. The method of claim 1, wherein the densities for the gauges correspond to nearest neighbor densities for the gauges.

5. The method of claim 1, wherein the densities for the gauges correspond to densities developed during a Kernel Density Estimation for the gauges.

6. The method of claim 1, wherein the weights for the gauges correspond to inverses of the densities of the gauges.

7. The method of claim 1, further comprising reducing, by the computing system, a dimensionality of the parameters for the gauges using a principal component analysis, wherein ascertaining the densities of the gauges is performed utilizing the parameters for the gauges having the reduced dimensionality.

8. A system comprising:
a memory system configured to store computer-executable instructions; and
a computing system, in response to execution of the computer-executable instructions, is configured to:
determine parameters for gauges describing features of an integrated circuit, wherein each gauge includes values corresponding to measurements collected for a set of the features;
ascertain densities of the gauges, wherein each of the densities corresponds to a relationship between the measurements associated with the parameters for one of the gauges and the measurements associated with the parameters for other gauges in the set of the gauges;
set weights for the gauges based, at least in part, on the densities of the gauges; and
calibrate an optical proximity correction (OPC) model using the weights for the gauges, wherein the OPC model calibrated with the weights of the gauges is configured to allow prediction of a printed image on a substrate described by a mask layout design corresponding to the integrated circuit.

9. The system of claim 8, wherein the computing system, in response to execution of the computer-executable instructions, is further configured to:
generate the gauges by grouping the features of an integrated circuit; and
associate an aggregation of the measurements for the features in each of the groups to gauges.

10. The system of claim 8, wherein the computing system, in response to execution of the computer-executable instructions, is further configured to ascertain the densities of the gauges by:
grouping the gauges based on their parameterized measurement values;
identifying relative densities for the groups for the groups of the gauges; and
determining the densities for the gauges based on the relative densities for the groups of the gauges.

11. The system of claim 8, wherein the densities for the gauges correspond to nearest neighbor densities for the gauges.

12. The system of claim 8, wherein the densities for the gauges correspond to densities developed during a Kernel Density Estimation for the gauges.

13. The system of claim 8, wherein the weights for the gauges correspond to inverses of the densities of the gauges.

14. An apparatus comprising at least one computer-readable memory device storing instructions configured to cause one or more processing devices to perform operations comprising:
determining parameters for gauges describing features of an integrated circuit, wherein each gauge includes values corresponding to measurements collected for a set of the features;
ascertaining densities of the gauges, wherein each of the densities corresponds to a relationship between the measurements associated with the parameters for one of the gauges and the measurements associated with the parameters for other gauges in the set of the gauges;
setting weights for the gauges based, at least in part, on the densities of the gauges; and
calibrating an optical proximity correction (OPC) model using the weights for the gauges, wherein the OPC model calibrated with the weights of the gauges is configured to allow prediction of a printed image on a substrate described by a mask layout design corresponding to the integrated circuit.

15. The apparatus of claim 14, wherein the instructions are configured to cause one or more processing devices to perform operations further comprising generating the gauges by grouping the features of an integrated circuit and associating an aggregation of the measurements for the features in each of the groups to gauges.

16. The apparatus of claim 14, wherein ascertaining the densities of the gauges further comprises:
grouping the gauges based on their parameterized measurement values;
identifying relative densities for the groups for the groups of the gauges; and
determining the densities for the gauges based on the relative densities for the groups of the gauges.

17. The apparatus of claim 14, wherein the densities for the gauges correspond to nearest neighbor densities for the gauges.

18. The apparatus of claim 14, wherein the densities for the gauges correspond to densities developed during a Kernel Density Estimation for the gauges.

19. The apparatus of claim 14, wherein the weights for the gauges correspond to inverses of the densities of the gauges.

20. The apparatus of claim 14, wherein the instructions are configured to cause one or more processing devices to perform operations further comprising reducing a dimensionality of the parameters for the gauges using a principal component analysis, wherein ascertaining the densities of the gauges is performed utilizing the parameters for the gauges having the reduced dimensionality.

* * * * *